US007893706B2

(12) United States Patent
Lee

(10) Patent No.: US 7,893,706 B2
(45) Date of Patent: Feb. 22, 2011

(54) TEST APPARATUS FOR LIQUID CRYSTAL DISPLAY DEVICE AND TEST METHOD USING THE SAME

(75) Inventor: Chae-Hyun Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 168 days.

(21) Appl. No.: 12/292,631

(22) Filed: Nov. 21, 2008

(65) Prior Publication Data

US 2009/0215347 A1 Aug. 27, 2009

(30) Foreign Application Priority Data

Feb. 21, 2008 (KR) ..................... 10-2008-0015840

(51) Int. Cl.
*G01R 31/00* (2006.01)

(52) U.S. Cl. ...................................................... 324/770

(58) Field of Classification Search ....................... None
See application file for complete search history.

(56) References Cited

U.S. PATENT DOCUMENTS

| | | | | |
|---|---|---|---|---|
| 4,845,426 | A * | 7/1989 | Nolan et al. | 324/760 |
| 7,417,444 | B2 * | 8/2008 | Shinada et al. | 324/751 |
| 2002/0027440 | A1 * | 3/2002 | Shinada et al. | 324/751 |
| 2003/0169060 | A1 * | 9/2003 | Shinada et al. | 324/751 |
| 2005/0227358 | A1 * | 10/2005 | McEntee et al. | 436/5 |
| 2006/0043982 | A1 * | 3/2006 | Shinada et al. | 324/751 |
| 2008/0302964 | A1 * | 12/2008 | Shinada et al. | 324/751 |

* cited by examiner

*Primary Examiner*—Jermele M Hollington
(74) *Attorney, Agent, or Firm*—McKenna Long & Aldridge LLP

(57) ABSTRACT

A test apparatus for a liquid crystal display device includes: a stage having a substrate thereon; a plurality of light emitting diodes (LEDs) on the stage and supplying a light to the substrate; a heating nozzle supplying a hot air to the substrate; a needle applying a test signal to the substrate; and a microscope inspecting the needle and the substrate.

12 Claims, 4 Drawing Sheets

TEST APPARATUS FOR LIQUID CRYSTAL DISPLAY DEVICE AND TEST METHOD USING THE SAME

This application claims the benefit of Korean Patent Application No. 2008-0015840, filed on Feb. 21, 2008, which is hereby incorporated by reference for all purposes as if fully set forth herein.

BACKGROUND OF THE INVENTION

1. Field of the Invention

The present application relates to a test apparatus, and more particularly, to a test apparatus for a liquid crystal display device and a test method of the liquid crystal display device.

2. Discussion of the Related Art

Although cathode-ray tubes (CRTs) have been widely used as a display device for a television, a measuring instrument or an information terminal, it is hard to apply the CRTs to reduced electronic products in size and weight because of their heavy weight and large volume. Recently, flat panel display (FPD) such as liquid crystal display (LCD) devices and plasma display panels (PDPs) have been the subject of research and development because of their superior thin profile and light weight as compared with the CRTs.

LCD devices include a liquid crystal panel having opposite two substrates and a liquid crystal layer between the two substrates. After first and second substrates, which include an array element and a color filter layer, respectively, are formed through repetition of a thin film deposition step, a photolithographic step and an etching step, a seal pattern is formed on one of the first and second substrates. The first and second substrates may be referred to as an array substrate and a color filter substrate, respectively. Next, the first and second substrates are attached, and the liquid crystal layer is formed between the first and second substrates to complete the liquid crystal panel. After polarizing plates and a driving circuit unit are attached to the liquid crystal panel, the liquid crystal panel constitutes the LCD device with a backlight unit.

The array element on the first substrate includes a switching element such as a thin film transistor (TFT) and various conduction lines which are formed of laminated layers of a conductive material, a semiconductor material and an insulating material. FIG. 1 is a perspective view showing an array substrate of a liquid crystal display device according to the related art. In FIG. 1, a gate line 26 and a data line 21 are formed on a substrate 12. The gate line 26 crosses the data line 21 to define a pixel region P. A thin film transistor (TFT) T is connected to the gate line 26 and the data line 21 and a pixel electrode 20 in the pixel region P is connected to the TFT T. A data pad 24 is formed at one end of the data line 21. Although not shown in FIG. 1, a gate pad is formed at one end of the gate line 26.

After the array substrate is completed, a visual test step where the array substrate is inspected with a naked eye of an operator is performed. For example, defects of the patterns and openings of the conductive lines may be detected in the visual test step. When the defects and the openings of the array substrate are detected, the positions corresponding to the defects and the openings are marked and an intensive test step for the array substrate is performed.

In the intensive test step, a real operational environment applied to the LCD device is required for more accurate result. Since the liquid crystal panel does not include a light source, the backlight unit is disposed under the liquid crystal panel to display images. In addition, the liquid crystal panel, the backlight unit and the driving circuit unit constitute the LCD device. Accordingly, light and heat from the backlight unit and heat from the driving circuit unit are supplied to the liquid crystal panel during the operation of the LCD device. As a result, it is required for the exact result of the intensive test to apply the real operational environment such as the light and the heat to the array substrate. Further, an apparatus for the intensive test is required to have an illuminating unit and a heating unit to apply the real operational environment to the array substrate.

SUMMARY OF THE INVENTION

Accordingly, the present invention is directed to a test apparatus for a liquid crystal display device and a method of using the test apparatus that substantially obviate one or more of the problems due to limitations and disadvantages of the related art.

An object of the present invention is to provide a test apparatus for an array substrate of a liquid crystal display device that includes an illuminating unit and a heating unit providing a real operational environment.

Another object of the present invention is to provide a test method for an array substrate of a liquid crystal display device where reliability is improved due to a real operational environment.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a test apparatus for a liquid crystal display device includes: a stage having a substrate thereon; a plurality of light emitting diodes (LEDs) on the stage and supplying a light to the substrate; a heating nozzle supplying a hot air to the substrate; a needle applying a test signal to the substrate; and a microscope inspecting the needle and the substrate.

In another aspect, a test method for a liquid crystal display device includes: loading a substrate on a stage; supplying a light from a plurality of light emitting diodes (LEDs) in the stage to the substrate; aligning a needle and a microscope to pads corresponding to defects of the substrate; supplying a hot air from a heating nozzle adjacent to the needle to the substrate; applying test signals to the pads through the needle; and measuring result signals through the needle.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments which are illustrated in the accompanying drawings. Wherever possible, similar reference numbers will be used to refer to the same or similar parts.

Figure 1:
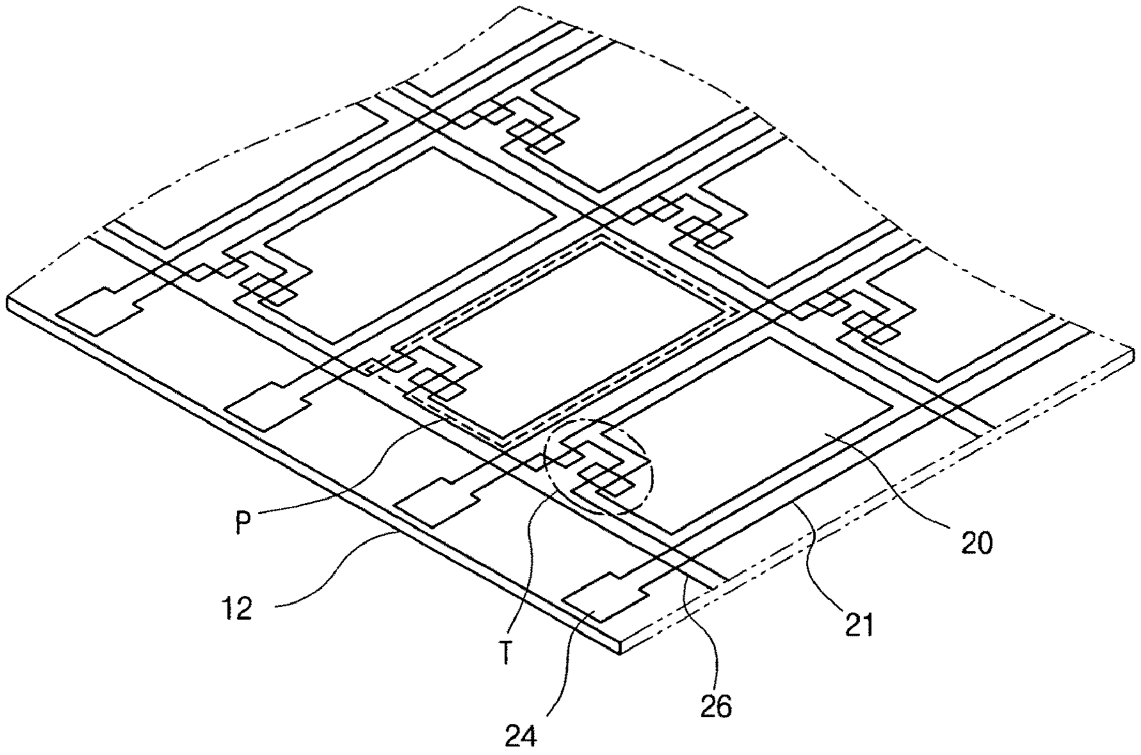
(related art) FIG. 1
FIG. 1 is a perspective view showing an array substrate of a liquid crystal display device according to the related art.
Figure 2:
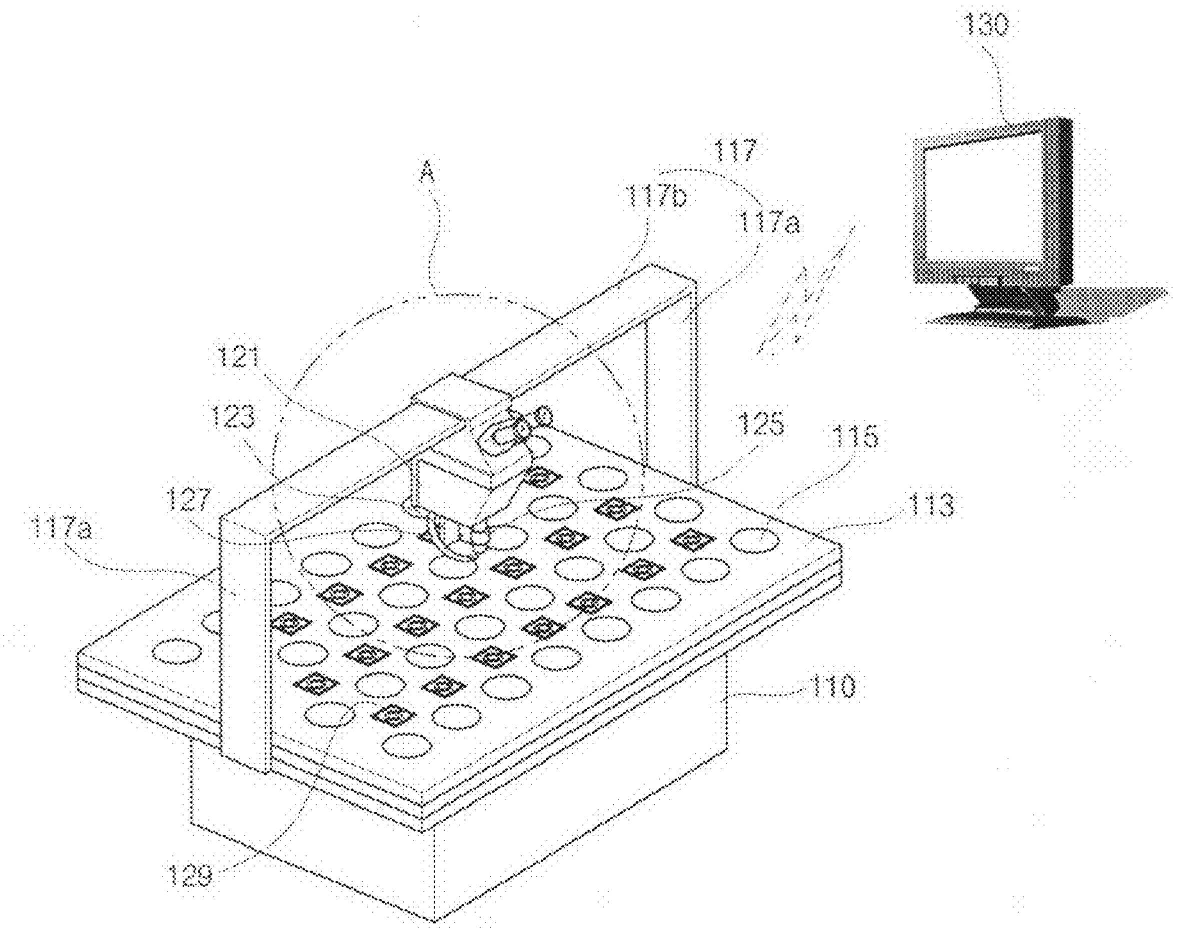
FIG. 2 is a perspective views showing a test apparatus for a liquid crystal display device according to an embodiment of the present invention.
Figure 3:
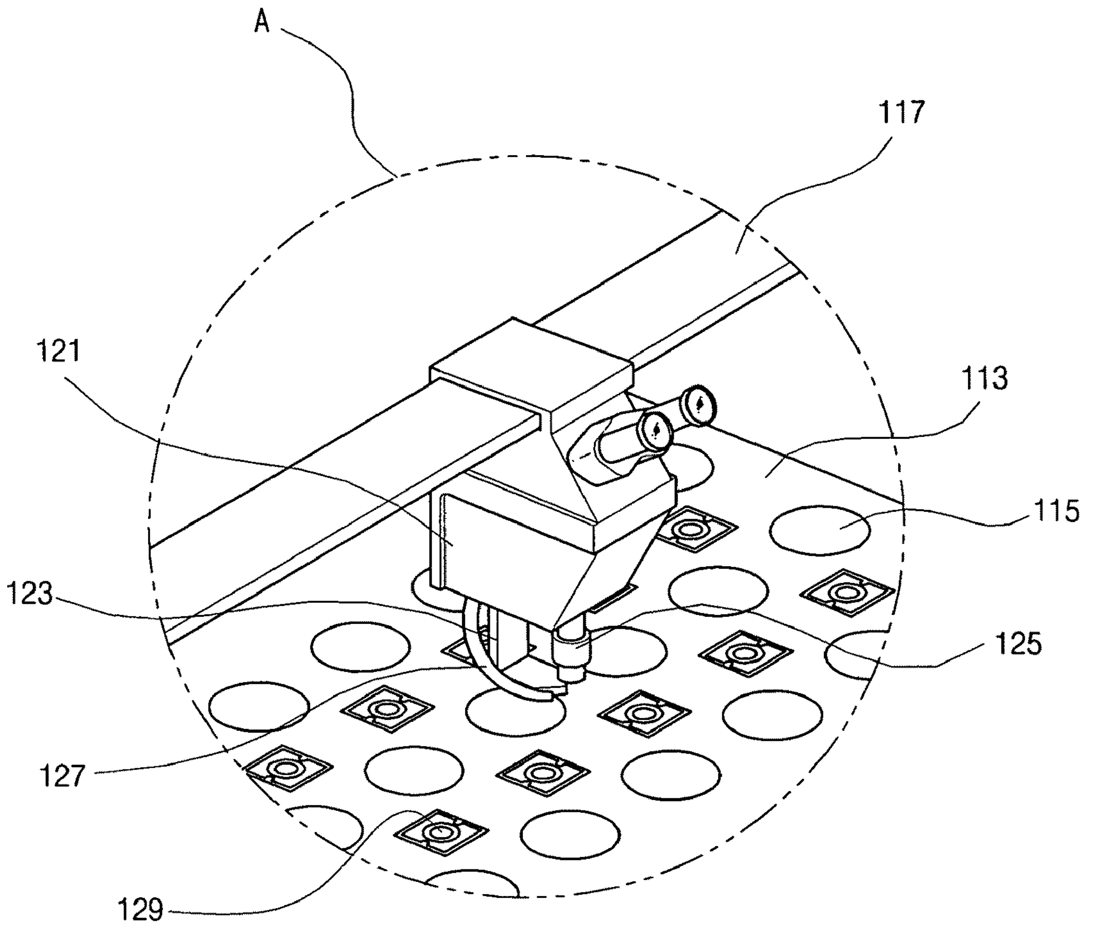
FIG. 3 is a magnified view of a portion A of FIG. 2.

FIG. 2 is a perspective view showing a test apparatus for a liquid crystal display device according to an embodiment of the present invention, and FIG. 3 is a magnified view of a portion A of FIG. 2.

In FIGS. 2 and 3, a test apparatus includes a supporter 110, a stage 113, a needle head 121, a needle 123, a microscope 125, a heating nozzle 127 and a bar 117. The stage 113 is disposed on the supporter 110 and an array substrate (not shown) of an LCD device may be loaded on the stage 113 for an intensive test under a real operational environment. In addition, the stage 113 may have a plurality of grooves and a plurality of light emitting diodes (LEDs) 115 in the plurality of grooves. The plurality of LEDs 115 supplies light to the array substrate. Since the light from the plurality of LEDs 115 has optical properties such as brightness, color uniformity and color temperature similar to the optical properties of the light from a backlight unit of an LCD device, the array substrate is tested under a real operational environment of luminance and the exact results are obtained. For example, the plurality of LEDs 115 may adjust a luminance for the array substrate from about 0 cd/m$^2$ to about 25000 cd/m$^2$. Accordingly, a light stress (LS), a light temperature stress (LTS) and a light bias temperature stress of the array substrate may be measured using the plurality of LEDs 115.

Although not shown, the array substrate includes a gate line, a data line, a thin film transistor (TFT) and a pixel electrode thereon. The gate line and the data line cross each other to define a pixel region. The TFT is connected to the gate line and the data line and the pixel electrode in the pixel region is connected to the TFT.

Further, although not shown, a diffusing plate may be formed over the plurality of LEDs 115 to make the light of the plurality of LEDs uniform by diffusion. In addition, a light sensor may be formed adjacent to the plurality of LEDs 115 to sense intensity and luminance of the light from the plurality of LEDs 115. Further, a cooling unit such as a fan may be formed adjacent to the plurality of LEDs 115 to minimize luminance variation according to temperature and prevent lifetime reduction. The plurality of LEDs 115 may include at least one of red, green and blue LEDs to obtain a property of the array substrate according to the wavelength spectrum of the light. In another embodiment, a cold cathode fluorescent lamp (CCFL) or an external electrode fluorescent lamp (EEFL) instead of the plurality of LEDs 115 may be used.

The needle 123 includes a plurality of probes (not shown) that contact pads (not shown) of the conductive lines of the array substrate for measuring an electric property. For example, each of the gate line, the data line and the TFT of the array substrate may be connected to the pads, and the plurality of probes may be electrically connected to each of the gate line, the data line and the TFT by the contact of the plurality of probes and the pads. After the positions of the pads of the array substrate are found, the plurality of probes may be aligned to the pads using the microscope 125. For example, the microscope 125 may have a relatively high magnification to inspect contact of the needle 123 and the pads.

The needle 123 and the microscope 125 are supported by the needle head 121. The needle head 121 is supported and movable along an x-axis and a y-axis by the bar 117 over the stage 113. The bar 117 includes a vertical portion 117*a* and a horizontal portion 117*b*. For example, the vertical portion 117*a* may be formed at both sides of the stage 113 and the horizontal portion 117*b* may be supported by the vertical portion 117*a*. In addition, the needle head 121 may be connected to the horizontal portion 117*b* of the bar 117. Since the vertical portion 117*a* is movable along the both sides of the stage 113 and the needle head 121 is movable along the horizontal portion 117*b*, the needle 123 and the microscope 125 fixed to the needle head 121 are horizontally movable along the x-axis and the y-axis to cover the whole area of the stage 113.

The heating nozzle 127 adjacent to the needle 123 and the microscope 125 supplies a hot air to the array substrate. The heating nozzle 127 may be supported by the needle head 121. Since the hot air provides a heat similar to the heat of an LCD device, the array substrate is tested under a real operational environment of temperature and the exact results are obtained. For example, the heating nozzle 127 may adjust a temperature of the array substrate from a room temperature of about 25° C. to about 120° C. Accordingly, a temperature stress (TS) of the array substrate may be measured using the heating nozzle 127.

In addition, a current of a TFT on the array substrate is measured while the temperature of the array substrate increases due to the hot air. If the array substrate is heated up by an electric means of a hot plate, the current of the TFT may be interfered by an electromagnetic signal generated by the electric means. However, since the array substrate is heated up by a non-electric means of the hot air, the current of the TFT is exactly measured without noise. The flux of the hot air may be adjusted by a valve (not shown) of the heating nozzle 127. In addition, a heat sensor sensing the temperature of the hot air may be formed adjacent to the heating nozzle 127.

Furthermore, a plurality of Peltier devices 129 may be formed on the stage 113. The plurality of Peltier devices 129 may be disposed at portions adjacent to the plurality of LEDs 115. Each Peltier device 129 adjusts the temperature of the array substrate using a Peltier effect that a contact surface between two different metals emits or absorbs a heat when a current flows through the contact surface. For example, each Peltier device 129 may adjust a temperature of the array substrate from about −25° C. to about 120° C. in a relatively short time period. Accordingly, a low temperature stress (LOTS) of the array substrate may be measured using the plurality of Peltier devices 129.

The test apparatus may be connected to a monitor 130 displaying the array substrate. In addition, the test apparatus may be connected to a control unit and a measuring instrument. For example, the control unit may drive the plurality of LEDs 115 and the bar 117, and the measuring instrument may include a multi-meter controlled by a computer. Further, a plurality of switches transmitting a power from the measuring instrument to the needle 123 and a memory unit where the test results is stored may be formed in the supporter 110.

As a result, since the array substrate is tested under a real operational environment of luminance and temperature in the test apparatus using the plurality of LEDs 115, the heating nozzle 127 and the plurality of Peltier devices 129, reliability of the intensive test step is improved.

Figure 4:
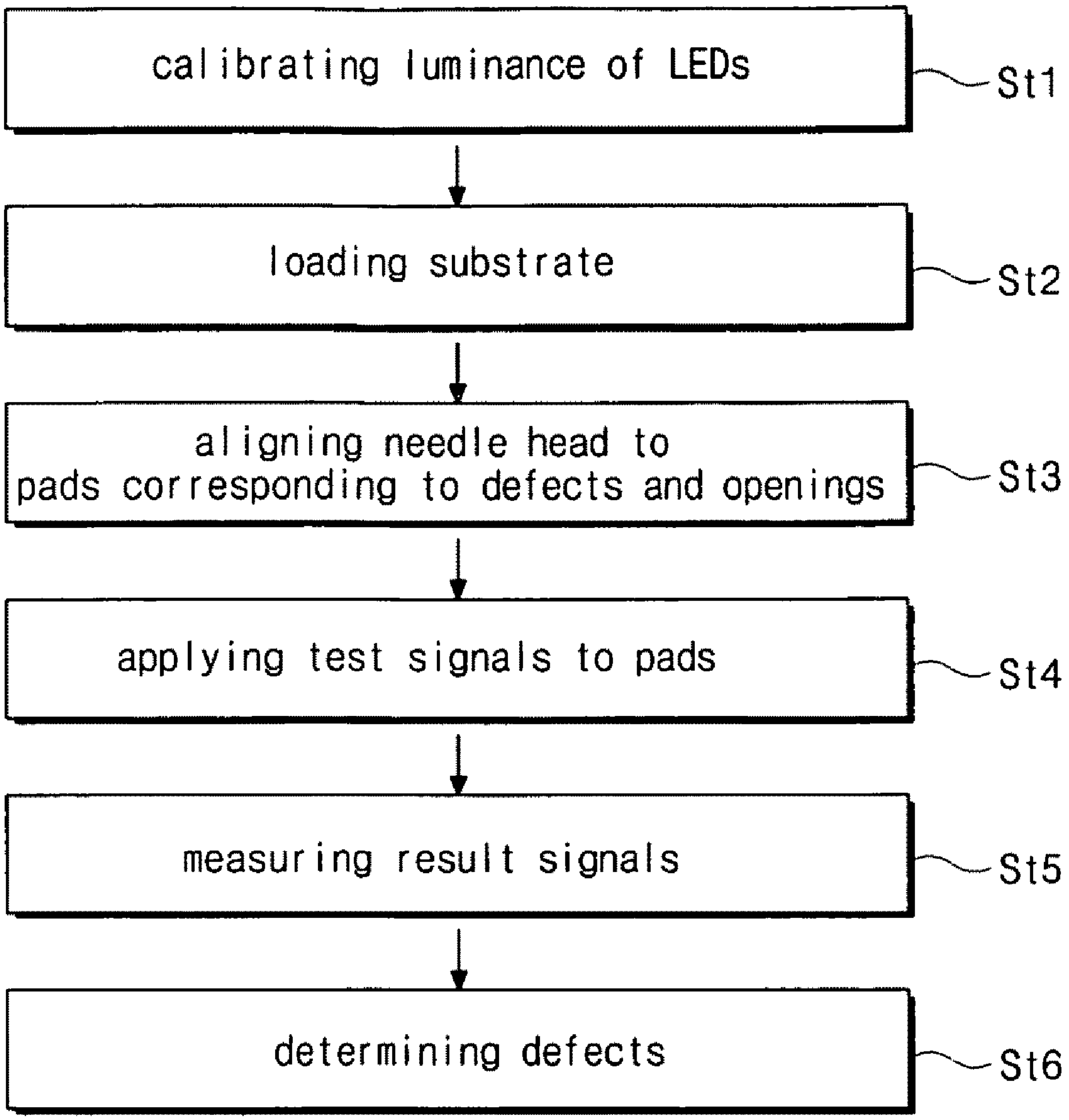
FIG. 4 is a flow chart illustrating a test method using a test apparatus for a liquid crystal display device according to an embodiment of the present invention.

FIG. 4 is a flow chart illustrating a test method using a test apparatus for a liquid crystal display device according to an embodiment of the present invention.

At a first step St1 of FIG. 4, a luminance of the plurality of LEDs 115 (of FIGS. 2 and 3) is calibrated before a substrate is loaded on the stage 113 (of FIGS. 2 and 3) of the test apparatus. The luminance of the plurality of LEDs 115 may be calibrated using a light sensor. For example, an increased power may be supplied to the plurality of LEDs 115 when the plurality of LEDs 115 has a luminance lower than a reference value, and a decreased power may be supplied to the plurality of LEDs 115 when the plurality of LEDs 115 has a luminance higher than the reference value. Accordingly, the plurality of LEDs 115 emits light having a constant luminance.

At a second step St2 of FIG. 4, the array substrate is loaded on the stage 113 of the test apparatus where the plurality of LEDs 115 supplies the light. Since the visual test step where the array substrate is inspected with a naked eye of an operator and portions corresponding to the defects and the openings are marked is performed before the array substrate is loaded on the stage 113, the array substrate has the marked portion corresponding to the defects and the openings of the pads and the conductive lines.

At a third step St3 of FIG. 4, the needle head 121 (of FIGS. 2 and 3) having the needle 123 (of FIGS. 2 and 3) and the microscope 125 (of FIGS. 2 and 3) moves along the x-axis and the y-axis and is aligned to the pads corresponding to the defects and the openings using the marks. While the needle head 121 is aligned to the pads, the hot air is supplied to the marked portions through the heating nozzle 127 and the monitor 130 (of FIG. 2) may display the marked portion with the coordinates thereof.

At a fourth step St4 of FIG. 4, the needle 123 contacts the pads and test signals for test are applied to the pads through the needle 123.

At a fifth step St5 of FIG. 4, result signals are measured through the needle 123. For example, a resistance between the pads may be measured as the result signals. While the result signals are measured, the plurality of LEDs 115 and the heating nozzle 127 may supply light and heat to form a real operational environment of luminance and temperature.

At a fifth step St5 of FIG. 4, performance of an additional repair step is determined by comparing the result signals with a reference signal stored in the measuring instrument. For example, the measured resistance may be compared with a predetermined reference value stored in the multi-meter and it is determined according to the comparison result whether an additional repair step is performed or not.

In the test method according to the embodiment of the present invention, since the array substrate for an LCD device is measured under a real operational environment of luminance and temperature, exact test results are obtained. Accordingly, reliability of the intensive test step is improved and quality of the LCD device is improved. In addition, the test apparatus may supply the light through the plurality of LEDs 115 without the hot air from the heating nozzle 127 so that the array substrate can be measured under a real operational environment of luminance. Furthermore, the test apparatus may supply the hot air through the heating nozzle 127 without the light from the plurality of LEDs 115 so that the array substrate can be measured under a real operational environment of temperature. Moreover, although the needle 123 and the microscope 125 are combined with the needle head 121 and the needle head 121 having the needle 123 and the microscope 125 horizontally moves over the array substrate in FIGS. 2 and 3, the needle and the microscope may independently move over the array substrate in another embodiment.

It will be apparent to those skilled in the art that various modifications and variations can be made in a test apparatus for a liquid crystal display device and a test method using the test apparatus of the present invention without departing from the spirit or scope of the invention. Thus, it is intended that the present invention cover the modifications and variations of this invention provided they come within the scope of the appended claims and their equivalents.

What is claimed is:

1. A test apparatus for a liquid crystal display device, comprising:

a stage having a substrate thereon;

a plurality of light emitting diodes (LEDs) on the stage and supplying a light to the substrate;

a heating nozzle supplying a hot air to the substrate;

a needle applying a test signal to the substrate; and a microscope inspecting the needle and the substrate, wherein the stage has a plurality of grooves and the plurality of LEDs are formed in the plurality of grooves, respectively.

2. The test apparatus according to claim 1, wherein the needle has a plurality of probes and the substrate has a plurality of pads, and the plurality of probes electrically contact the plurality of pads to apply the test signals.

3. The test apparatus according to claim 1, wherein the heating nozzle, the needle and the microscope are movable over the stage.

4. The test apparatus according to claim 1, further comprising a diffusing plate over the plurality of LEDs.

5. The test apparatus according to claim 1, further comprising a plurality of light sensor adjacent to plurality of LEDs and sensing an intensity and a luminance of the light.

6. The test apparatus according to claim 1, further comprising a heat sensor sensing a temperature of the hot air.

7. The test apparatus according to claim 1, further comprising a plurality of peltier devices on the stage.

8. The test apparatus according to claim 1, wherein the substrate comprises:

a gate line and a data line crossing each other to define a pixel region;

a thin film transistor connected to the gate line and the data line; and a pixel electrode in the pixel region and connected to the thin film transistor.

9. The test apparatus according to claim 8, wherein the needle is electrically connected to the gate line, the data line and the thin film transistor to apply the test signals.

10. The test apparatus according to claim 1, further comprising a needle head supporting the heating nozzle, the needle and the microscope.

11. A test apparatus for a liquid crystal display device, comprising:

a stage having a substrate thereon;

a plurality of light emitting diodes (LEDs) on the stage and supplying a light to the substrate;

a heating nozzle supplying a hot air to the substrate;

a needle applying a test signal to the substrate;

a microscope inspecting the needle and the substrate; and a bar supporting the needle head, the bar including a vertical portion formed at both sides of the stage and a horizontal portion supported by the vertical portion.

12. A test method for a liquid crystal display device, comprising:

loading a substrate on a stage;

supplying a light from a plurality of light emitting diodes (LEDs) in the stage to the substrate;

aligning a needle and a microscope to pads corresponding to defects of the substrate;

supplying a hot air from a heating nozzle adjacent to the needle to the substrate;

applying test signals to the pads through the needle;

measuring result signals through the needle;

calibrating a luminance of the plurality of LEDs;

inspecting the substrate with a naked eye and marking portions corresponding to the defects and the openings; and determining an additional repair step by comparing the result signals with a reference signal.

* * * * *